March 31, 1970 J. C. MADDISON 3,503,796

THIN FILM CIRCUITS

Filed March 17, 1967

United States Patent Office 3,503,796
Patented Mar. 31, 1970

3,503,796

THIN FILM CIRCUITS

John C. Maddison, Ilford, England, assignor to The Plessey Company Limited, Ilford, England, a British company Filed Mar. 17, 1967, Ser. No. 623,922
Claims priority, application Great Britain, Mar. 31, 1966, 14,400; Apr. 7, 1966, 15,584
Int. Cl. B44d *1/18;* B05c *11/12*
U.S. Cl. 117—212 2 Claims

ABSTRACT OF THE DISCLOSURE

A method of locating a thin film circuit substrate relative to a mask. The substrate is caused to move by centrifugal force to a datum position at which it is correctly located with respect to the mask. A thin film circuit is deposited upon the positioned substrate through the mask.

Figures 1, 2:
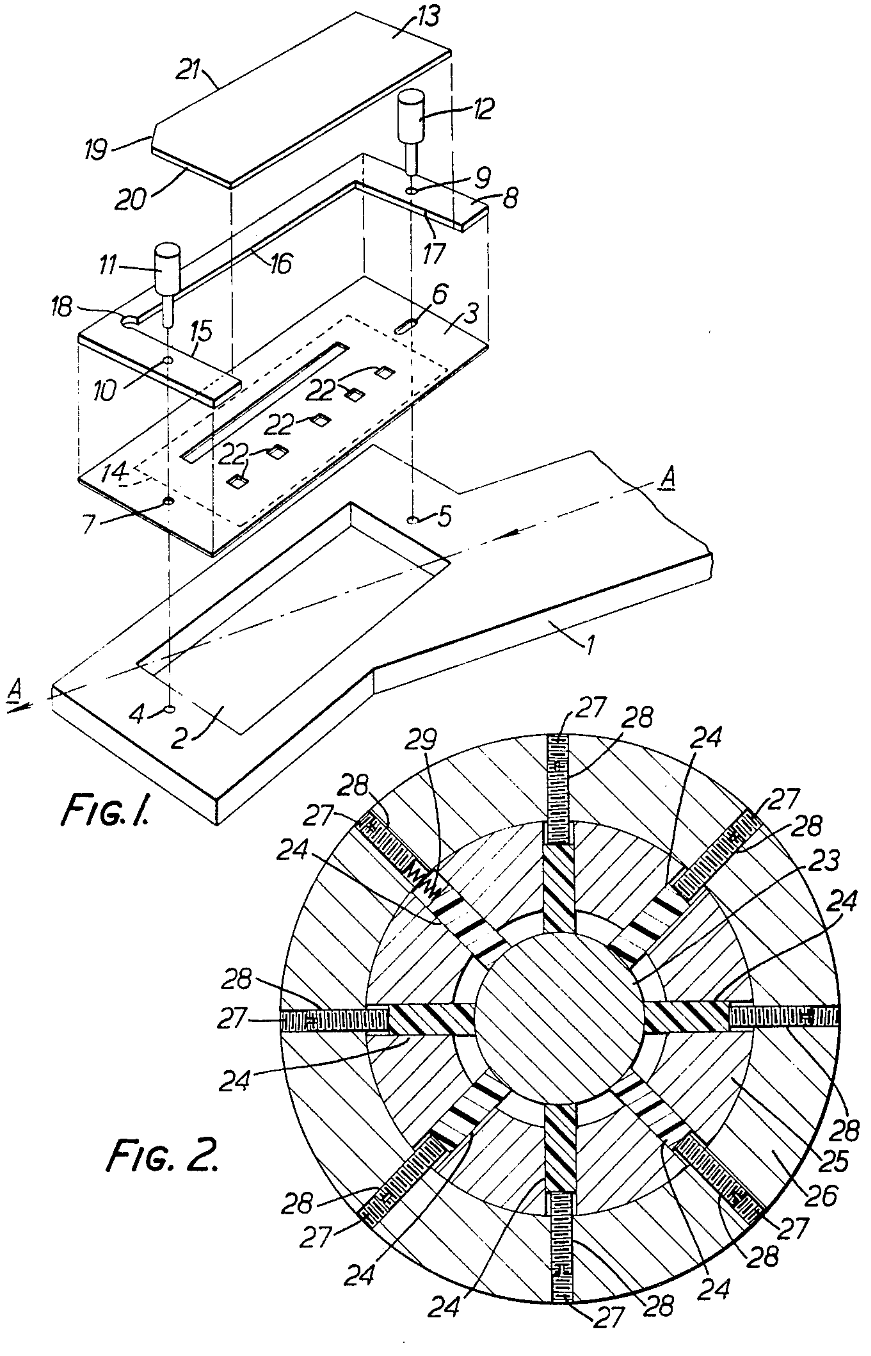

This invention relates to thin film circuits.

One method of depositing a thin film circuit pattern on to a substrate comprises evaporating the said pattern on to those regions of a substrate surface not covered by a mask. A necessary requirement for the method is for accurate location of the substrate with respect to the mask, so that the thin film circuit pattern is deposited with a high degree of positional accuracy on the surface of the substrate.

To facilitate high speed production of thin film circuits according to the above described method it is clearly important that the apparatus used should enable the substrate upon which the circuit is to be formed to be inserted into and withdrawn from association with the mask in a simple fashion.

According to one aspect of the invention a method of accurately locating a thin film circuit substrate in contact with a mask comprises constraining the substrate to move to a predetermined position relative to the mask by centrifugal force.

According to another aspect of the present invention a method of locating a substrate relative to a mask through which a thin film circuit is to be deposited comprises the step of positioning the substrate adjacent the mask so that it is free to move relative to the mask mounted on part of a centrifuge apparatus and then subjecting the assembly to centrifugal force so that the substrate is constrained to move to a datum position at which it is correctly located with respect to the mask.

The apparatus for retaining the substrate according to the invention may comprise a frame located above and preferably secured in contact with the mask so as to define a nest for receiving the substrate in contact with the mask. The nest is secured to rotatable table means which when operated causes the substrate to move into contact with the edges of the frame defining a datum position of the substrate relative to the mask.

The nest may comprise two flat mutually perpendicular inside edges of the frame which cooperate with corresponding mutually perpendicular surface edges of the substrate.

The mask, the frame, and the table are located in contact with each other by means of two pins which pass through respective holes in each part.

In order to ensure intimate contact between the inside edges of the frame and the edges of the substrate throughout their lengths, the corner between the said inside edges may be cut away and the corner of the substrate defined by the said mutually perpendicular edges may be cut away to correspond.

An exemplary embodiment of the invention will now be described with reference to the accompanying drawings, in which:

FIGURE 1 is an exploded, perspective view of apparatus for centrifugally locating and retaining a thin film substrate, and FIGURE 2 is a sectional view of a bearing and shaft suitable for use in connection with the apparatus of FIGURE 1.

An arm 1, is associated with a turntable (not shown) so that the radius of the turntable runs along the chain line A—A. The turntable is arranged to be rotatable in a vacuum deposition chamber so that the material to be deposited is able to evaporate from a heated crucible positioned below the arm 1 and pass up through the hole 2 each time it passes over the crucible. A thin metal mask 3, which in this example is made of molybdenum, is positioned on the arm 1 so that holes 4 and 5 in the arm are aligned with holes 7 and 6, respectively, as shown in the drawing. An open frame 8 is then positioned on top of the mask so that holes 10 and 9 therein are arranged in mutual alignment with the holes 7 and 4, and 6 and 5, respectively. A retaining pin 11 is then inserted into holes 10, 7 and 4 and a corresponding retaining pin 12 is inserted into holes 9, 6 and 5 thereby to sandwich the mask 3 between the frame 8 and the arm 1 to define a nest for receiving a substrate 13 (e.g., glass). The base of the nest is defined by the surface of the mask enclosed by dashed line 14 and the sides of the nest are defined by the inside edges 15, 16 and 17 of the frame 8. The inside edges 15 and 16 of the frame 8 are carefully machined to be precisely mutually perpendicular and the corner 18 of the frame and the corresponding corner 19 of the substrate are cut away to ensure that edges 20 and 21 of the substrate will mate perfectly with the inside edges 15 and 16 of the frame.

When the turntable is rotated the centrifugal force due to rotation will act along the radius A—A of the arm in the direction of the arrow to retain the substrate 13 in contact with the edges 15 and 16 of the frame 8. By careful forming of the holes 6, 7, 9 and 10 so that the retaining pins 11 and 12 are a tight fit therein the position of the substrate is accurately defined relative to the mask. In order to allow for expansion of the mask during exposure to the high temperatures associated with the deposition process the hole 6 is elongated. During the deposition process the substrate is precisely located with respect to the mask and held in contact with it so that evaporated material passing through the hole 2 in the rotatable arm 1 is deposited on the substrate surface through apertures 22 in the mask.

It will be understood that the material of the substrate and of the mask will be capable of withstanding the elevated temperatures reached during deposition of the thin films. Such temperatures may be of the order of 300° C. and above.

From the foregoing description of one exemplary embodiment it will be appreciated that the turntable of the centrifuge apparatus may have a large number of radial arms such as the arm 1 shown in the drawing and each of these arms may be arranged for the accommodation and the positioning of substrates prior to the deposition of thin films as fully described above.

A bearing for the turntable shaft which will operate satisfactorily under high vacuum conditions is shown in FIGURE 2. A turntable shaft 23 is journalled for rotation between eight bearing elements 24 of rectangular cross section fabricated from a fluorinated hydrocarbon such as PTFE (polytetrafluoroethylene) or PCTFE (polychlorotrifluoroethylene). The bearing elements 24 are located in radial passageways of rectangular cross section which are machined in an inner annulus 25 of stainless steel and may have a curved bearing surface to correspond with the curvature of the shaft 23. The inner annulus 25 is fitted in an outer stainless steel annulus 26 having tapped holes 27 extending radially therethrough in alignment with the radial passageways in the inner annulus. Grub screws 28 are accommodated in the tapped holes the ends of the grub screws being arranged to project inwardly so as to bear against the ends of the bearing elements 24. For positional adjustment of the bearing elements the grub screws may be approximately adjusted. The inner and outer annuli may be mounted as convenient. It is also envisaged that the bearing elements may be spring loaded as illustrated by the interposition of spring 29 between one grub screw and its associated bearing element, so that they are spring urged into contact with the shaft. Although in this example eight bearing elements are used, it may be preferable to use more for some applications, or less for some other applications.

What I claim is:

1. A method of accurately locating a thin film circuit substrate in contact with a mask which comprises constraining the substrate to move to a predetermined position relative to the mask by centrifugal force.

2. A method as claimed in claim 1 of locating a substrate relative to a mask through which a thin film circuit is deposited which comprises the steps of mounting the mask on part of a centrifuge apparatus then positioning the substrate adjacent the mask so that it is free to move relative to the mask and then subjecting the apparatus to centrifugal force so that the substrate is constrained to move to a datum position at which it is correctly located with respect to the mask.

References Cited

UNITED STATES PATENTS

| | | | |
|---|---|---|---|
| 3,205,855 | 9/1965 | Ault | 117—38 X |
| 3,230,109 | 1/1966 | Domaleski | 117—212 |
| 3,312,572 | 4/1967 | Norton et al. | 117—212 |
| 3,352,280 | 11/1967 | Hughes et al. | 118—52 X |
| 3,408,982 | 11/1968 | Capita | 118—52 X |
| 3,450,581 | 6/1969 | Shortes | 117—212 X |

FOREIGN PATENTS

| | | |
|---|---|---|
| 780,727 | 8/1957 | Great Britain. |

ALFRED L. LEAVITT, Primary Examiner

T. E. BOKAN, Assistant Examiner

U.S. Cl. X.R.

117—38, 101; 118—52, 504